United States Patent
Lee et al.

(10) Patent No.: US 9,291,868 B2
(45) Date of Patent: Mar. 22, 2016

(54) LIQUID CRYSTAL DISPLAY

(75) Inventors: Chang-Soo Lee, Cheonan-si (KR); Kee-Bum Park, Cheonan-si (KR); Yun Jae Park, Seoul (KR); Jong Jae Lee, Asan-si (KR); Hoi Sik Moon, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 1024 days.

(21) Appl. No.: 13/242,875

(22) Filed: Sep. 23, 2011

(65) Prior Publication Data

US 2012/0200818 A1    Aug. 9, 2012

(30) Foreign Application Priority Data

Feb. 7, 2011    (KR) .......................... 10-2011-0010746

(51) Int. Cl.
| | |
|---|---|
| *G02F 1/136* | (2006.01) |
| *G02F 1/1343* | (2006.01) |
| *G02F 1/1362* | (2006.01) |
| *H01L 29/417* | (2006.01) |

(52) U.S. Cl.
CPC .......... *G02F 1/1362* (2013.01); *G02F 1/13624* (2013.01); *G02F 1/136286* (2013.01); *H01L 29/41733* (2013.01)

(58) Field of Classification Search
CPC .............. G02F 1/1362; G02F 1/13624; G02F 1/136286; H01L 29/41733
USPC ............................................ 349/142–146, 48
See application file for complete search history.

(56) References Cited

U.S. PATENT DOCUMENTS

| | | | |
|---|---|---|---|
| 8,803,777 B2 * | 8/2014 | Do et al. .......................... | 345/90 |
| 2007/0268418 A1 * | 11/2007 | Lin et al. .......................... | 349/38 |
| 2010/0157185 A1 * | 6/2010 | Kim ...................... | G02F 1/1362 349/38 |

* cited by examiner

*Primary Examiner* — Charles Chang
(74) *Attorney, Agent, or Firm* — F. Chau & Associates, LLC

(57) ABSTRACT

A liquid crystal display includes a plurality of pixels arranged in a matrix, each pixel having a first sub-pixel electrode and a second sub-pixel electrode. A first thin film transistor is connected to the first sub-pixel electrode. A second thin film transistor is connected to the second sub-pixel electrode. A third thin film transistor is connected to the second sub-pixel electrode. A fourth thin film transistor is connected to a drain electrode of the third thin film transistor. A first gate line is connected to the first thin film transistor and the second thin film transistor. A data line is connected to the first thin film transistor and the second thin film transistor. A second gate line is connected to the third thin film transistor. A third gate line is connected to the fourth thin film transistor.

14 Claims, 6 Drawing Sheets

LIQUID CRYSTAL DISPLAY

CROSS-REFERENCE TO RELATED APPLICATION

This application claims priority to and the benefit of Korean Patent Application No. 10-2011-0010746 filed in the Korean Intellectual Property Office on Feb. 7, 2011, the entire contents of which are incorporated by reference herein.

BACKGROUND OF THE INVENTION (a) Field of the Invention The present disclosure relates to a liquid crystal display (LCD).

(b) Discussion of the Related Art

An LCD is one of the most widely used flat panel displays. An LCD includes two display panels provided with electric field generating electrodes, such as pixel electrodes and a common electrode, and a liquid crystal layer interposed between the two display panels. In the LCD, voltages are applied to the electric field generating electrodes to generate an electric field in the liquid crystal layer. Due to the generated electric field, liquid crystal molecules of the liquid crystal layer are aligned and polarization of incident light is controlled, thereby displaying images.

The liquid crystal displays also include switching elements connected to individual pixel electrodes, and a plurality of signal lines, such as gate lines and data lines, for controlling the switching elements so as to apply voltages to the pixel electrodes.

Among the LCDs, a vertical alignment (VA) mode LCD, which aligns LC molecules such that their long axes are perpendicular to the panels in the absence of an electric field, is spotlighted because of its high contrast ratio and wide reference viewing angle. Here, the reference viewing angle can be a viewing angle that has a contrast ratio of 1:10, or a critical angle of gray-to-gray luminance reversion.

To approximate side visibility to front visibility in the vertical alignment mode LCD, a method of causing a difference in transmittance by dividing one pixel into two sub-pixels and applying different voltages to the two sub-pixels has been suggested.

An example of the method includes applying the same voltage to two sub-pixels and dropping the voltage of one sub-pixel by using a separate switching element. In the LCD, when the polarity of the pixel voltage is reversed, due to the difference between the pixel voltage charged during the previous frame and the pixel voltage charged during the present frame, the capacitance of a step-down capacitor may be changed, and it becomes difficult to correctly control the voltages of two sub-pixel electrodes.

Therefore, when the voltages of two sub-pixel electrodes are not correctly controlled and the voltage charged during the previous frame is influenced, display quality is deteriorated.

SUMMARY OF THE INVENTION

Exemplary embodiments of the present invention provides for the control of voltages of two sub-pixel electrodes even when the polarity of a pixel voltage is inverted.

According to an exemplary embodiment a liquid crystal display includes a plurality of pixels having a first sub-pixel electrode and a second sub-pixel electrode and arranged in a matrix. A first thin film transistor is connected to the first sub-pixel electrode. A second thin film transistor is connected to the second sub-pixel electrode. A third thin film transistor is connected to the second sub-pixel electrode. A fourth thin film transistor is connected to a drain electrode of the third thin film transistor. A first gate line is connected to the first thin film transistor and the second thin film transistor. A data line is connected to the first thin film transistor and the second thin film transistor. A second gate line is connected to the third thin film transistor. A third gate line is connected to the fourth thin film transistor.

The source electrode of the fourth thin film transistor may be connected to the drain electrode of the third thin film transistor, and the drain electrode of the fourth thin film transistor may overlap the first gate line.

The third gate line may be applied with a gate-on signal after the first gate line and the second gate line are applied with a gate-off signal.

The third gate line may be applied with the gate-on signal during a vertical blank period.

The liquid crystal display may further include a capacitor electrode configured to overlap the drain electrode of the third thin film transistor.

The first sub-pixel electrode and the second sub-pixel electrode may include a plurality of branches, and a plurality of regions having different directions of edges of the branches.

The edges of the branches may form an angle of 45° or 135° with the first gate line.

According to an exemplary embodiment an LCD includes an upper display panel, a lower display panel, and a liquid crystal layer interposed between the lower display panel and upper display panel. The upper display panel includes a common electrode. The lower panel includes a plurality of pixel electrodes, each pixel electrode having a first sub-pixel electrode and a second sub-pixel electrode separated from each other. The first sub-pixel electrode and the second sub-pixel electrode receive a data voltage and generate an electric field in conjunction with the common electrode to determine a direction of liquid crystal molecules of the liquid crystal layer. Each sub-pixel includes one or more basic electrodes, each basic electrode having a cross-shaped stem formed by a transverse stem and a vertical stem perpendicular to the transverse stem, each basic electrode being divided into a plurality of sub-regions by the transverse stem and the vertical stem, each sub-region comprising a plurality of branches of the basic electrode, the branches extending from the transverse stem or the vertical stem.

The branches may be configured to distort the electric field such that the liquid crystal molecules are inclined in a direction parallel to a length direction of the branches.

The plurality of sub-regions may include four sub-regions, each of the four sub-regions having length directions of the branches different from each other, such that the directions of the liquid crystal molecules inclined in the length directions are diversified to increase a viewing angle of the liquid crystal display.

The branches may form an angle of approximately 45 degrees or 135 degrees with the transverse stem.

The branches of adjacent sub-regions may be orthogonal to each other.

The branches may have a width in the range of 2.5 to 5.0 μm, and gaps between adjacent branches in a sub-region are in the range of 2.5 to 5.0 μm.

According to an exemplary embodiment a pixel for an LCD is provided. The pixel includes a pair of sub-pixels, the pair of sub-pixels having a first sub-pixel switching element, a second sub-pixel switching element, a third switching element, a fourth switching element, a first liquid crystal capacitor, a second liquid crystal capacitor, a step-down capacitor, and a refresh capacitor. The first sub-pixel switching element and the second sub-pixel switching element are connected to a first gate line and a data line, and the third switching element is connected to a second gate line. The first sub-pixel switching element and the second sub-pixel switching element each include a control terminal connected to the first gate line, an input terminal connected to the data line, and an output terminal respectively connected to the first liquid crystal capacitor and the second liquid crystal capacitor. The third switching element includes a control terminal connected to the second gate line, an input terminal connected to the second liquid crystal capacitor and the output terminal connected to the step-down capacitor that is connected to the output terminal of the third switching element and a capacitor electrode line. The fourth switching element includes a control terminal connected to a refresh signal line, an input terminal connected to the step-down capacitor, and an output terminal connected to the refresh capacitor that is connected to the output terminal of the fourth switching element and the second gate line. When the first gate line is applied with a gate-on signal, the first liquid crystal capacitor and the second liquid crystal capacitor become equally charged, and when the gate signal applied to the first gate line is changed from the gate-on voltage to a gate-off voltage and the gate signal applied to the second gate line is changed from the gate-off voltage to the gate-on voltage, charges charged to the second liquid crystal capacitor are partially moved to the step-down capacitor, the charged voltage of the second liquid crystal capacitor being decreased and the step-down capacitor being charged, such that the charged voltage of the second liquid crystal capacitor is lower than the charged voltage of the first liquid crystal capacitor.

After one frame image is displayed, a refresh signal line may be applied with the gate-on signal during a vertical blank period in which the data signal is not applied, and when the refresh signal line is applied with the gate-on signal such that the fourth switching element is turned on, charges charged to the step-down capacitor can be moved to the refresh capacitor.

The LCD according to an exemplary embodiment of the present invention can discharge all charges charged to the step-down capacitor after one frame is finished such that the capacitance of the step-down capacitor may not be influenced by the polarity of the pixel voltage of the previous frame. Accordingly, the capacitance of the step-down capacitor may be constantly controlled such that the voltages of two sub-pixel electrodes may be correctly controlled, and thereby the lateral visibility may be closest to the front visibility and deterioration of the display quality may be prevented.

DETAILED DESCRIPTION

Figure 1:
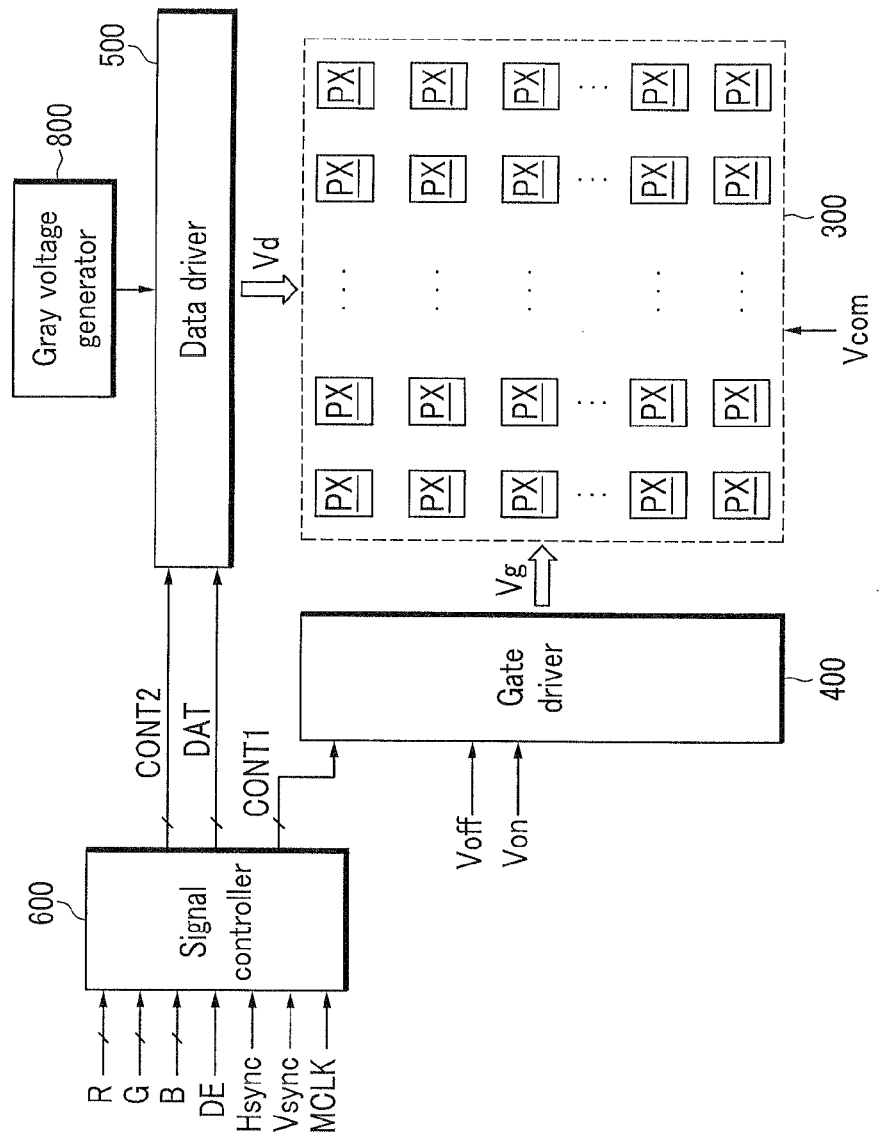
FIG. 1 is a block diagram of an LCD according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Firstly, an LCD according to an exemplary embodiment of the present invention will be described with reference to FIG. 1 and FIG. 2.

Figure 2:
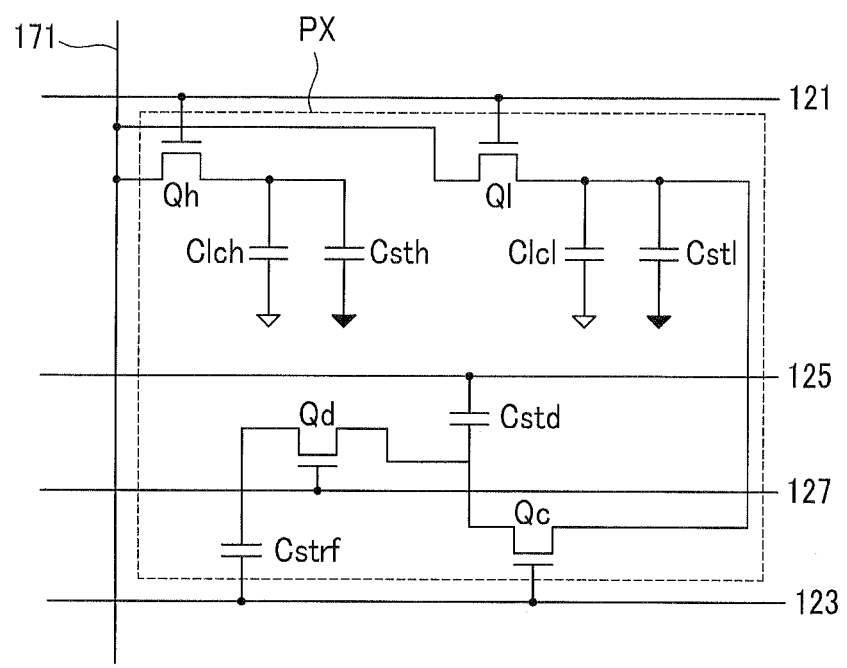
FIG. 2 is an equivalent circuit diagram of one pixel of an LCD according to an exemplary embodiment of the present invention.

FIG. 1 is a block diagram of an LCD according to an exemplary embodiment of the present invention, and FIG. 2 is an equivalent circuit diagram of one pixel of an LCD according to an exemplary embodiment of the present invention.

As shown in FIG. 1, an LCD according to an exemplary embodiment of the present invention includes a liquid crystal panel assembly 300, a gate driver 400, a data driver 500, a gray voltage generator 800, and a signal controller 600.

In an equivalent circuit, the liquid crystal panel assembly 300 includes a plurality of signal lines 121, 123, 125, 127, 171, and a plurality of pixels PX that are connected to the signal lines and arranged substantially in a matrix.

Referring to FIG. 2, the signal lines include a plurality of gate lines 121, 123 that transmit a gate signal (also referred to as "a scanning signal") to control the application of data to a pixel, a plurality of data lines 171 that transmit a data voltage, a plurality of capacitor electrode lines 125 that transmit a common voltage Vcom, and a refresh signal line 127. The plurality of gate lines 121, 123, the plurality of capacitor electrode lines 125, and the refresh signal line 127 extend in a row direction and are substantially parallel to each other, and the plurality of data lines 171 extend in a column direction and are substantially parallel to each other.

The liquid crystal panel assembly according to the present exemplary embodiment includes a plurality of signal lines and a plurality of pixels PX connected thereto.

Each pixel PX includes a pair of sub-pixels, and includes a first switching element Qh, a second switching element Ql, a third switching element Qc, a fourth switching element Qd, a first liquid crystal capacitor Clch, a second liquid crystal capacitor Clcl, a step-down capacitor Cstd, and a refresh capacitor Cstrf.

The first switching element Qh and the second switching element Ql are both connected to the first gate line 121 and the data line 171, and the third switching element Qc is connected to the second gate line 123.

The first switching element Qh and the second switching element Ql, as a three terminal element such as a thin film transistor provided in a thin film transistor array panel, include a control terminal connected to the first gate line 121, an input terminal connected to the data line 171, and an output terminal connected to the first liquid crystal capacitor Clch and the second liquid crystal capacitor Clcl.

The third switching element Qc, as a three terminal element such as a thin film transistor provided in the thin film transistor array panel, includes a control terminal connected to the second gate line 123, an input terminal connected to the second liquid crystal capacitor Clcl, and the output terminal connected to the step-down capacitor Cstd.

The step-down capacitor Cstd, which is configured to assist in voltage control of the second liquid crystal capacitor Clcl, is connected to the output terminal of the third switching element Qc and the capacitor electrode line 125, and is formed by overlapping the capacitor electrode line 125 provided in the thin film transistor array panel and the output electrode of the third switching element Qc via an insulator.

The fourth switching element Qd, as a three terminal element such as a thin film transistor provided in the thin film transistor array panel, includes a control terminal connected to the refresh signal line 127, an input terminal connected to the step-down capacitor Cstd, and an output terminal connected to the refresh capacitor Cstrf.

The refresh capacitor Cstrf, which is configured to assist in discharging charges charged to the step-down capacitor Cstd after one frame is finished, is connected to the output terminal of the fourth switching element Qd and the second gate line 123, and is formed by overlapping the output electrode of the fourth switching element Qd and a portion of the second gate line 123 via the insulator.

Referring again to FIG. 1, the gray voltage generator 800 can generate either all gray voltages or a predetermined number of gray voltages (or reference gray voltages) related to the transmittance of the pixels PX. The (reference) gray voltages may include one set having a positive value for a common voltage Vcom, and another set having a negative value, the positive and negative values being used for various frame inversions, such as column/row inversion and dot inversion, to avoid damage to pixels from being constantly applied with the same polarity voltage.

The gate driver 400 is connected to the gate lines 121, 123 and the refresh signal line 127 of the liquid crystal panel assembly 300, and applies gate signals obtained by combining a gate-on voltage Von to drive the gate lines and a gate-off voltage Voff to shut of the gate line driving.

The data driver 500 is connected to the data lines DL of the liquid crystal panel assembly 300, and selects the gray voltages from the gray voltage generator 800 to apply them to the data lines 171 as data voltages. In the situation when the gray voltage generator 800 does not supply a voltage for all grays but supplies only a predetermined number of reference gray voltages, the data driver 500 divides the reference gray voltages to generate the data voltages.

The signal controller 600 controls the gate driver 400 and the data driver 500.

Each of the drivers 400, 500, 600, 800 may be directly mounted on the liquid crystal panel assembly 300 in the form of at least one IC chip, may be mounted on a flexible printed circuit film (not shown) and then mounted on the liquid crystal panel assembly 300 in the form of a tape carrier package (TCP), or may be mounted on a separate printed circuit board (not shown). Alternatively, the drivers 400, 500, 600, 800 may be integrated with the liquid crystal panel assembly 300 together with, for example, the signal lines 121, 123, 125, 127, 171 and the thin film transistor switching elements Qh, Ql, Qc, Qd. The drivers 400, 500, 600, 800 may be integrated into a single chip. In this case, at least one of the drivers or at least one circuit forming the drivers may be arranged outside the single chip.

Figure 3:
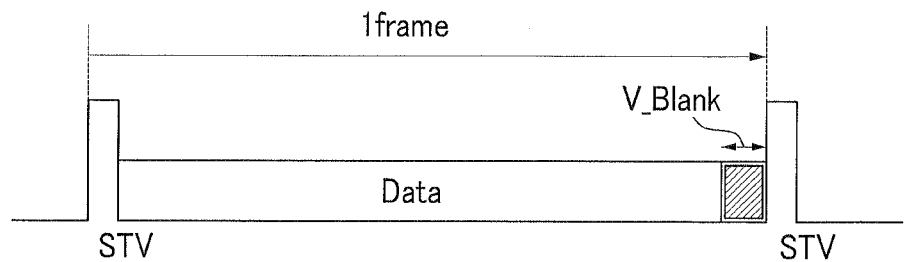
FIG. 3 depicts signals applied to an LCD according to an exemplary embodiment of the present invention.
Figure 4:
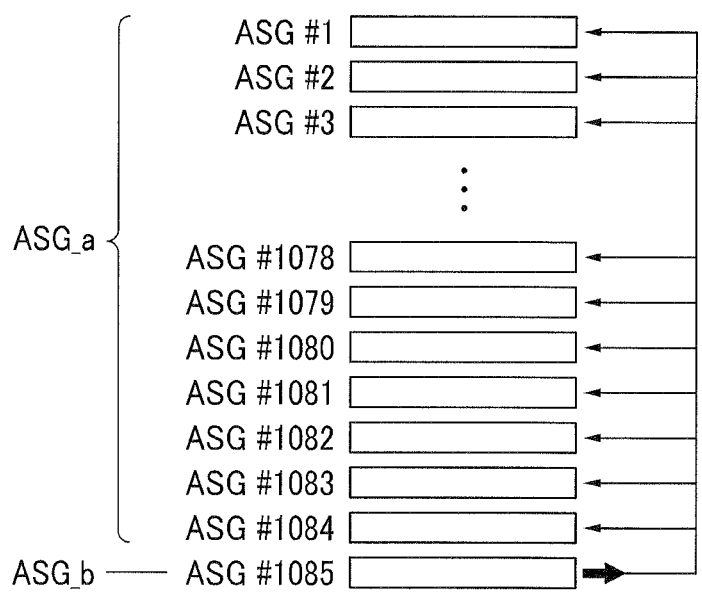
FIG. 4 is a schematic depiction of a portion of a gate driver of an LCD according to an exemplary embodiment of the present invention.

Next, a driving method of an LCD according to an exemplary embodiment of the present invention will be described with reference to FIG. 3 and FIG. 4 as well as FIG. 2. FIG. 3 is a depiction of a representative signal applied to an LCD during one frame according to an exemplary embodiment of the present invention, and FIG. 4 is a schematic depiction of a portion of a gate driver of an LCD according to an exemplary embodiment of the present invention.

A more detailed description will be now given with respect to a particular row of pixels, for example, an i-th pixel row.

Referring to FIG. 2 and FIG. 3 along with FIG. 1, the first gate line 121 of the i-th row is applied with the gate-on signal, and the first liquid crystal capacitor Clch and the second liquid crystal capacitor Clcl are applied with the data signal Data through the turned on first switching element Qh and second switching element Ql. Here, the data voltages Vd applied to the first liquid crystal capacitor Clch and the second liquid crystal capacitor Clcl are equal to each other. Accordingly, the first liquid crystal capacitor Clch and the second liquid crystal capacitor Clcl are equally charged by the difference between the common voltage and the data voltage Vd.

Next, when the gate signal applied to the first gate line 121 is changed from the gate-on voltage to the gate-off voltage and simultaneously the gate signal applied to the second gate line 123 is changed from the gate-off voltage Voff to the gate-on voltage Von, the first switching element Qh and the second switching element Ql are turned off, and the third switching element Qc is turned on. Thus, the charges charged to the second liquid crystal capacitor Clcl are partially moved to the step-down capacitor Qstd. Accordingly, the charged voltage of the second liquid crystal capacitor Clcl is decreased and the step-down capacitor Cstd is charged. The charged voltage of the second liquid crystal capacitor Clcl is decreased by the capacitance of the step-down capacitor Cstd such that the charged voltage of the second liquid crystal capacitor Cstl is lower than the charged voltage of the first liquid crystal capacitor Csth.

Here, the charged voltages of the first liquid crystal capacitor Clch and the second liquid crystal capacitor Clcl express different gamma curves, which are combined to be a complex gamma curve of a pixel voltage. Gamma curves help convert non-linear relationships between applied voltages and light intensities to linear relationships. A frontal view complex gamma curve coincides with a reference gamma curve at an optimally-determined front side, and a lateral view gamma curve approximates the frontal view reference gamma curve. In this way, the image data are converted so that the lateral visibility can be improved.

When this process progresses for all pixels connected to the first gate line 121 and the second gate line 123, the plurality of pixels are all applied with the data signal Data.

The above process is repeated by a unit of one horizontal period which is also called "1H" and is the same as one cycle of the horizontal synchronization signal Hsync and the data enable signal DE, thereby applying data voltages Vd to all the pixels PX and displaying images of one frame which commence with pulse STV as seen in FIG. 3.

After one frame image is displayed, the refresh signal line 127 is applied with the gate-on signal during a vertical blank period V_Blank in which the data signal Data is not applied.

When the refresh signal line 127 is applied with the gate-on signal such that the fourth switching element Qd is turned on, the charges charged to the step-down capacitor Cstd are all moved to the refresh capacitor Cstrf connected to the second gate line 123 that is floated through the turned-on fourth switching element Qd.

Through this process, one frame is completed. As above described above, the LCD according to an exemplary embodiment of the present invention discharges all charges that are charged to the step-down capacitor Cstd between one frame and the next frame, regardless of the polarity of the voltage that is charged during the previous frame. Accordingly, deterioration of the display quality can be prevented in view of the use of the step-down capacitor Cstd and the refresh capacitor Cstrf.

Referring to FIG. 4, a gate driver according to an exemplary embodiment of the present invention includes a first driver ASG_a having units ASG#1, . . . ASG#1084 that sequentially apply the gate-on signal to a plurality of gate lines 121, 123 and a second driver ASG_b to sequentially apply the gate-on signal to the refresh signal line 127 of the units ASG#1, ASG#1084. After all first gate lines 121, 123 are sequentially applied with the gate-on signal through the first driver ASG_a, the refresh signal line 127 is applied with the gate-on signal through the second driver ASG_b before the start of the next frame. In the LCD according to the present exemplary embodiment, the second driver ASG_b of the gate driver applies the gate-on signal to the refresh signal line 127. The gate signal is only the gate-on/off signal and the operation is, therefore, simple, and helps keeps the manufacturing cost down.

Next, an exemplary embodiment of the LCD shown in FIG. 2 will now be described in detail with reference to FIGS. 5, 6 and 7.

Figure 5:
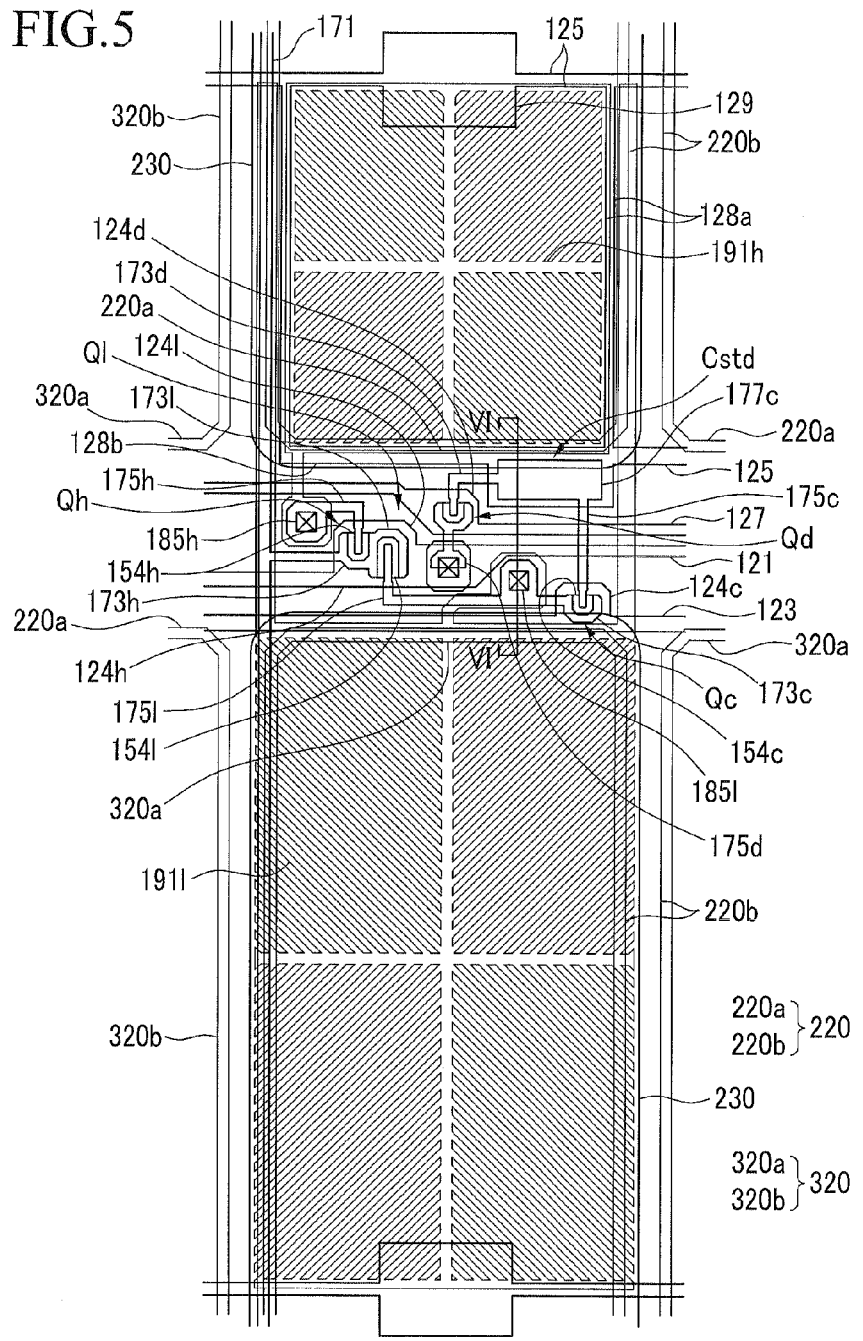
FIG. 5 is a layout view of a liquid crystal panel according to an exemplary embodiment of the present invention.
Figure 6:
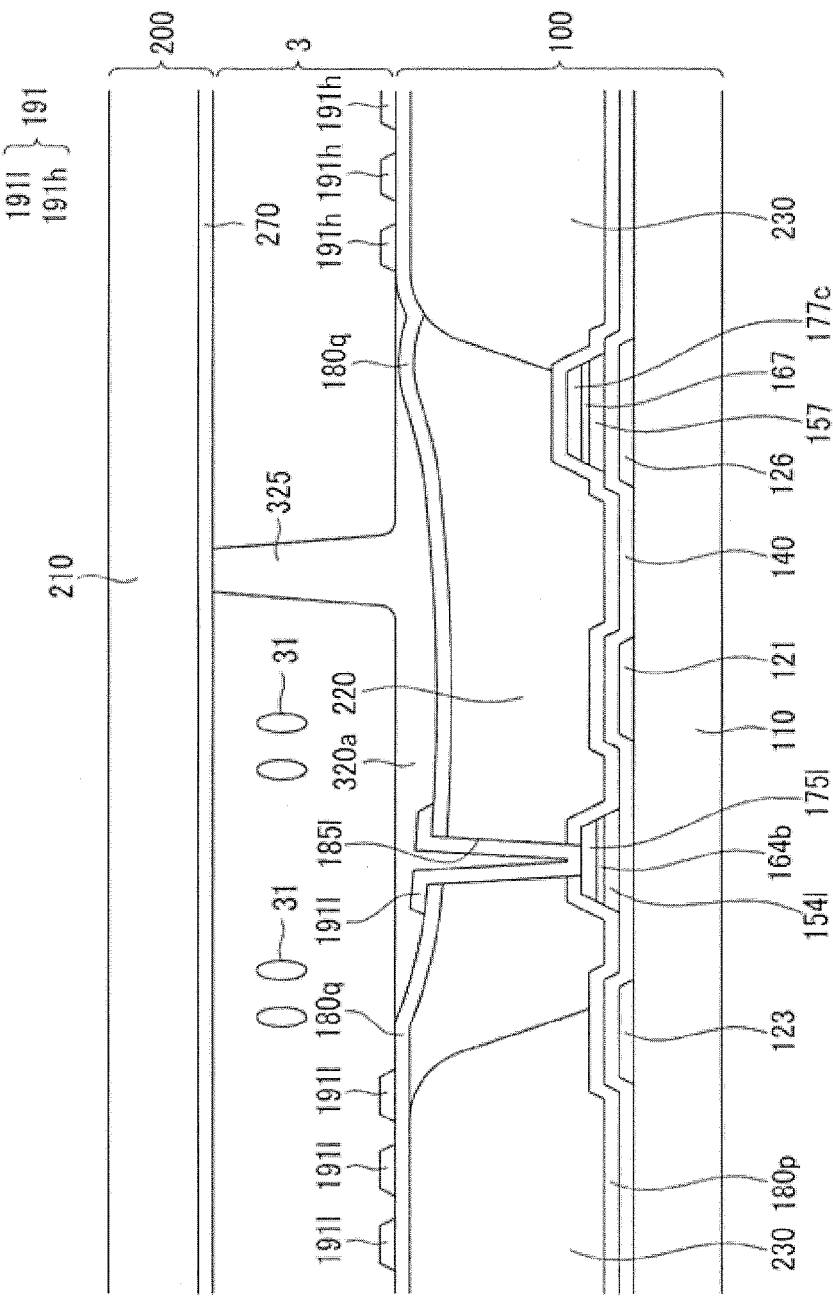
FIG. 6 is a cross-sectional view taken along the line VI-VI of FIG. 5.

FIG. 5 is a layout view of a liquid crystal panel according to an exemplary embodiment of the present invention. FIG. 6 is a cross-sectional view taken along the line VI-VI of FIG. 5. FIG. 7 is a layout view of a pixel electrode of the liquid crystal panel shown in FIG. 4.

An LCD according to the present exemplary embodiment includes a lower panel 100 and an upper panel 200 facing each other, a liquid crystal layer 3 interposed between the two display panels 100, 200, and a pair of polarizers (not shown) attached at the outer surfaces of the display panels 100, 200.

The lower panel 100 will be first described.

A plurality of gate conductors including a plurality of gate lines 121, 123, a plurality of capacitor electrode lines 125, and a plurality of refresh signal lines 127 are formed an insulation substrate 110.

The gate lines 121, 123 and the refresh signal lines 127 transmit the gate signals and mainly extend in a transverse direction (as viewed in the figure). The first gate line 121 includes a first gate electrode 124h and a second gate electrode 124l protruding upward and downward (as viewed in the figure), and the second gate line 123 includes a third gate electrode 124c that protrudes upward. The first gate electrode 124h and the second gate electrode 124l are connected to each other to form one protrusion portion. The refresh signal line 127 includes a fourth gate electrode 124d that is extended.

The capacitor electrode line 125 extends in the transverse direction, and transfers a predetermined voltage such as a common voltage Vcom. The capacitor electrode line 125 includes a storage electrode 129 that protrudes upward and downward, a pair of vertical portions 128a that vertically extend downward with respect to the gate line 121, and a transverse portion 128b that connects ends of a pair of vertical portions 128a to each other. The transverse portion 127 includes a capacitor electrode 126 that expands downward.

A gate insulating layer 140 is formed on the gate conductors 121, 123, 125, 127.

A plurality of semiconductor stripes (not shown) made of amorphous silicon (a-Si), crystalline silicon, or so on are formed on the gate insulating layer 140. The semiconductor stripes mainly extend in the longitudinal direction, and each semiconductor stripe includes first and second semiconductors 154h, 154l that extend toward the first and second gate electrodes 124h, 124l and connect to each other, and a third semiconductor 154c connected to the second semiconductor 154l. The third semiconductor 154c is extended thereby forming a fourth semiconductor 157. The fourth semiconductor 157 is extended toward the fourth gate electrode 124d.

A plurality of ohmic contact stripes (not shown) are formed on the semiconductor stripes 151, a first ohmic contact (not shown) is formed on the first semiconductor 154h, and a second ohmic contact 164b, a third ohmic contact (not shown), and a fourth ohmic contact (not shown) are respectively formed on the second semiconductor 154l, the third semiconductor 154c, and the fourth semiconductor 157. The ohmic contact stripe includes a first protrusion (not shown) forming a pair along with the first ohmic contact and disposed on the first protrusion of the semiconductor, a second protrusion (not shown) forming a pair along with the second ohmic contact 164b and disposed on the second protrusion of the semiconductor, and a third protrusion (not shown) forming a pair along with the third ohmic contact island and disposed on the third protrusion of the semiconductor. The third ohmic contact is extended thereby forming a fourth ohmic contact 167.

A data conductor including a plurality of data lines 171, a plurality of first drain electrodes 175h, a plurality of second drain electrodes 175l, a plurality of a third drain electrodes 175c, and a plurality of fourth drain electrodes 175d are formed on the ohmic contacts that are not shown.

The data lines 171 transmit data signals and extend in the longitudinal direction thereby intersecting the first gate line 121, the second gate line 123, and the refresh signal line 127. Each data line 171 includes a first source electrode 173h and a second source electrode 173l that extend toward the first gate electrode 124h and the second gate electrode 124l and form a "W" shape.

The first drain electrode 175h, the second drain electrode 175l, and the third drain electrode 175c include a wide end portion and the other rod-shaped end portion. The rod-shaped end portions of the first drain electrode 175h and the second drain electrode 175l are surrounded by the first source electrode 173h and the second source electrode 173l, respectively. The wide end portion of the second drain electrode 175l again extends to form a U-shaped third source electrode 173c. The wide end 177c of the third drain electrode 175c is overlapped with the capacitor electrode 126 to form the step-down capacitor Cstd and the rod-shaped end is partially surrounded by the third source electrode 173c. Also, the other end of the third drain electrode 175c extends to form a fourth source electrode 173d. One end of the fourth drain electrode 175d surrounds the fourth source electrode 173d, and the other end of the fourth drain electrode 175d overlaps the extension of the first gate line 121 to form the refresh capacitor Cstrf.

The first, second, third and fourth gate electrodes 124h, 124l, 124c, 124d, the first, second, third and fourth source electrodes 173h, 173l, 173c, 173d and the first, second, the third and fourth drain electrodes 175h, 175l, 175c, 175d respectively form the first, second, third and fourth thin film transistors (TFT) Qh, Ql, Qc, Qd along with the first, second, third and fourth semiconductors 154h, 154l, 154c, 157, and the channels of the thin film transistors are respectively formed in the semiconductors 154h, 154l, 154c, 157 between the source electrodes 173h, 173l, 173c, 173d and the drain electrodes 175h, 175l, 175c, 175d.

The semiconductor stripe including the semiconductors 154h, 154l, 154c, 157 except for the channel region between the source electrodes 173h, 173l, 173c, 173d and the drain electrodes 175h, 175l, 175c, 175d substantially has the same plane shape as the data conductors 171, 175h, 175l, 175c, 173*d*, 175*d* and the underlying ohmic contacts that are not shown, 164*l*, 167. That is, in the semiconductor stripe that includes the semiconductors 154*h*, 154*l*, 154*c*, 157, there are portions between source electrodes 173*h*, 173*l*, 173*c* and drain electrodes 175*h*, 175*l*, 175*c*, and exposed portions that are not covered by the data conductors 171, 175*h*, 175*l*, 175*c*.

A lower passivation layer 180*p* that is made of an inorganic insulator such as silicon nitride or silicon oxide is formed on the data conductors 171, 175*h*, 175*l*, 175*c* and the exposed portion of the semiconductors 154*h*, 154*l*, 154*c*, 157.

A color filter 230 is disposed on the lower passivation layer 180*p*. The color filter 230 is disposed at most regions with the exception of regions in which the first thin film transistor Qh, the second thin film transistor Ql, the third thin film transistor Qc, and the fourth thin film transistor Qd are disposed. However, it may vertically extend in a vertical direction along the space between the data lines 171 that are adjacent to each other. Each color filter 230 may display any one of three primary colors of red, green, and blue colors.

On the region in which the color filter 230 is not disposed and a portion of the color filter 230, a light blocking member 220 is disposed. The light blocking member 220 (typically called a black matrix) is provided to prevent light leakage. The light blocking member 220 extends along the gate lines 121, 123 and expands upward and downward, and includes a first light blocking member 220*a* that covers the region in which the first thin film transistor Qh, the second thin film transistor Ql, and the third thin film transistor Qc are formed, and a second light blocking member 220*b* that extends along the data line 171. The height of the portion of the light blocking member 220 may be lower than the height of the color filter 230.

An upper passivation layer 180*q* is formed on the color filter 230 and the light blocking member 220. The upper passivation layer 180*q* prevents peeling of the color filter 230 and the light blocking member 220, and suppresses contamination of the liquid crystal layer 3 by organic material of the solvent that could flow from the color filter 230, so that defects, such as afterimages that may occur when an image is driven, can be prevented.

The lower passivation layer 180*p*, the light blocking member 220, and the upper passivation layer 180*q* have a plurality of first contact holes 185*h* and a plurality of second contact holes 185*l* exposing the wide end portion of the first drain electrode 175*h* and the second drain electrode 175*l*.

A plurality of pixel electrodes 191 are formed on the upper passivation layer 180*q*.

Figure 7:
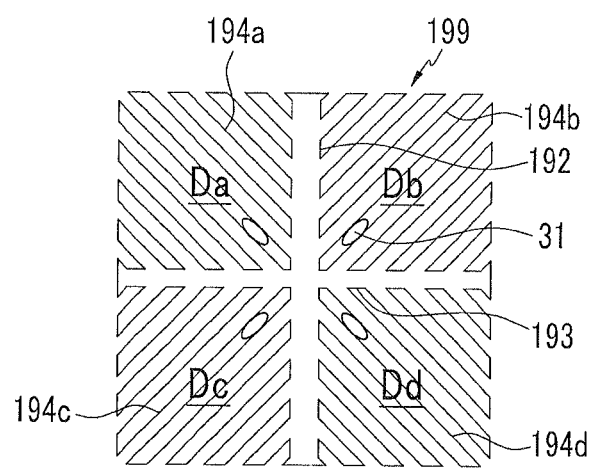
FIG. 7 is a layout view of a pixel electrode of the liquid crystal panel shown in FIG. 4.

With reference to FIG. 5, each pixel electrode 191 includes a first sub-pixel electrode 191*h* and a second sub-pixel electrode 191*l* that are separated from each other with two gate lines 121, 123 therebetween and that are disposed above and beneath the pixel area with the center of the gate lines 121, 123 being adjacent in a column direction, and the first sub-pixel electrode 191*h* and the second sub-pixel electrode 191*l* include one or more basic electrodes 199 or modifications thereof shown in FIG. 7.

Hereinafter, referring to FIG. 7, the basic electrode 199 will be described in detail.

As shown in FIG. 7, the entire shape of the basic electrode 199 is quadrangular, and it includes a cross-shaped stem that is formed of a transverse stem 193 and a vertical stem 192 that is perpendicular thereto. In addition, the basic electrode 199 is divided into a first sub-region Da, a second sub-region Db, a third sub-region Dc, and a fourth sub-region Dd by the transverse stem 193 and the vertical stem 192, and each sub-region Da-Dd includes a plurality of first to fourth fine branches 194*a*, 194*b*, 194*c*, 194*d*.

The first fine branches 194*a* extend obliquely in an upper left direction from the transverse stem 193 or the vertical stem 192, and the second fine branches 194*b* extend obliquely in an upper right direction from the transverse stem 193 or the vertical stem 192. In addition, the third fine branches 194*c* extend obliquely in a lower left direction from the transverse stem 193 or the vertical stem 192, and the fourth fine branches 194*d* extends obliquely in a lower right direction from the transverse stem 193 or the vertical stem 192.

The first to fourth fine branches 194*a*, 194*b*, 194*c*, 194*d* form an angle of approximately 45 degrees or 135 degrees with the gate lines 121*a* and the 121*b* or the transverse stem 193. Further, the fine branches 194*a*, 194*b*, 194*c*, 194*d* of the adjacent sub-areas Da, Db, Dc, Dd may be orthogonal to each other.

The widths of the fine branches 194*a*, 194*b*, 194*c*, 194*d* may be in the range of 2.5 to 5.0 µm, and a gap between the adjacent fine branches 194*a*, 194*b*, 194*c*, 194*d* in one sub-area Da, Db, Dc, or Dd may be in the range of 2.5 to 5.0 µm.

According to another embodiment of the present invention, the widths of the fine branches 194*a*, 194*b*, 194*c*, 194*d* may become wider as the fine branches are closer to the transverse stem 193 or the vertical stem 192. Further, a difference between the widest portion and the narrowest portion in one fine branch 194*a*, 194*b*, 194*c*, or 194*d* may be in the range of 0.2 to 1.5 µm.

The first sub-pixel electrode 191*h* and the second sub-pixel electrode 191*l* can include a circumference stem (not shown) that surrounds the circumference thereof, and the vertical portion of the circumference stem extends along the data line 171 and may prevent capacitive coupling between the data line 171 and the first sub-pixel electrode 191*h* and the second sub-pixel electrode 191*l*. The first sub-pixel electrode 191*h* and the second sub-pixel electrode 191*l* receive a data voltage through the first contact hole 185*h* and the second contact hole 185*l* from the first drain electrode 175*h* and the second drain electrode 175*l*, respectively. The first sub-pixel electrode 191*h* and the second sub-pixel electrode 191*l* to which the data voltage is applied generate an electric field in conjunction with the common electrode 270 of the common electrode panel 200 to determine a direction of liquid crystal molecules 31 of the liquid crystal layer 3 between two electrodes 191, 270. As described above, according to the determined direction of the liquid crystal molecule, the luminance of light that passes through the liquid crystal layer 3 is changed.

The sides of the first to fourth fine branched portions 194*a*, 194*b*, 194*c*, 194*d* can distort an electric field between the sub-pixel electrode and the common electrode and form a horizontal component that determines an inclination direction of the liquid crystal molecules 31. The horizontal components of the electric field are substantially parallel to the sides of the first to fourth fine branches 194*a*, 194*b*, 194*c*, 194*d*. Therefore, as shown in FIG. 7, the liquid crystal molecules 31 are inclined in a direction that is parallel to a length direction of the fine branches 194*a*, 194*b*, 194*c*, 194*d*. Since one pixel electrode 191 includes four sub-regions Da to Dd in which length directions of the fine branches 194*a*, 194*b*, 194*c*, 194*d* are different from each other, the directions where the liquid crystal molecules 31 are inclined are about four directions, and four domains where the alignment directions of the liquid crystal molecules 31 are different from each other are formed in the liquid crystal layer 3. As described above, by diversifying the inclination direction of the liquid crystal molecules, the standard viewing angle of the LCD is increased, that is, lateral viewing of the displayed images become substantially comparable to frontal viewing of the displayed images.

The first sub-pixel electrode 191h and the common electrode 270 form the first liquid crystal capacitor Clch in conjunction with the liquid crystal layer 3 therebetween, and the second sub-pixel electrode 191l and the common electrode 270 form the second liquid crystal capacitor Clcl in conjunction with the liquid crystal layer 3 therebetween, so the applied voltage is maintained even though the first and second thin film transistors Qh, Ql are turned off.

The first and second sub-pixel electrodes 191h, 191l overlap the sustain electrode 129 and the capacitor electrode line 125 to form the first and second sustain capacitors Csth, Cstl, and the first and second sustain capacitors Csth, Cstl strengthen the voltage maintaining ability of the first and second liquid crystal capacitors Clch, Clcl.

The capacitor electrode 126 and an extended portion 177c of the third drain electrode 175c overlap with the gate insulating layer 140 and semiconductor layers 157, 167 therebetween to form a step-down capacitor Cstd. In another exemplary embodiment of the present invention, the semiconductor layers 157, 167 disposed between the capacitor electrode 126 and the extended portion 177c of the third drain electrode 175c that constitute the step-down capacitor Cstd may be removed.

The expansion of the gate line 121 and the expanded end portion of the fourth drain electrode 175d overlap each other via the gate insulating layer 140 and the semiconductor layer 157, 167 to form the refresh capacitor Cstrf. In another exemplary embodiment of the present invention, the semiconductor layers 157, 167 disposed between the gate line 121 and the capacitor electrode 126 and the extended portion of the fourth drain electrode 175d that constitutes the refresh capacitor Cstd may be removed.

A colored member 320 is formed on the upper passivation layer 180q. The colored member 320 is disposed on the light blocking member 220. The colored member 320 extends according to the gate line 121 and the second gate line 123 and is expanded up and down, and includes a first colored member 320a and a second colored member 320b disposed according to the first light blocking member 220a covering the region where the first thin film transistor Qh, the second thin film transistor Ql, and the third thin film transistor Qc are positioned and the second light blocking member 220b extending according to the data line 171.

The colored members 320a, 320b compensate for the height difference between the light blocking member 220 and the color filter 230, and thereby the cell interval of the liquid crystal layer disposed on the color filter 230 and the liquid crystal layer disposed on the light blocking member 220 can be uniformly controlled, and the light blocking function of the light blocking member 220 for the light leakage is enhanced. As described above, the colored members 320a, 320b compensate for the height difference between the light blocking member 220 and the color filter 230 such that the light leakage generated by the liquid crystal molecules that are disposed between the light blocking member 220 and the color filter 230 and are not normally controlled by the step between the light blocking member 220 and the color filter 230 may be prevented on the edge of the pixel electrode. Also, the cell interval on the light blocking member 220 is reduced such that the average cell interval is reduced, and accordingly the total amount of liquid crystal used in the LCD may be reduced.

A lower alignment layer (not shown) is formed on the pixel electrode 191, the exposed upper passivation layer 180q, and the colored members 320a, 320b. The lower alignment layer may be a vertical alignment layer.

The upper panel 200 will now be described in more detail.

A common electrode 270 is formed on an insulation substrate 210. An upper alignment layer (not shown) is formed on the common electrode 270. The upper alignment layer may be a vertical alignment layer.

Polarizers (not shown) for controlling light transmittance are provided on the outer surfaces of the two display panels 100, 200, the transmissive axes of two polarizers are crossed, and in accordance with an exemplary embodiment one transmissive axis is parallel to the gate line 121.

The liquid crystal layer 3 has negative dielectric anisotropy wherein the liquid crystal molecules of the liquid crystal layer 3 are arranged such that a longitudinal axis of the liquid crystal molecules may be perpendicular to the surfaces of the two panels 100, 200 in the case in which an electric field does not exist. Accordingly, the incident light does not transmit through the crossed polarizers and is blocked in the case in which an electric field does not exist.

As described above, the first subpixel electrode 191h and the second subpixel electrode 191l that are applied with the data voltage generate the electric field along with the common electrode 270 of the common electrode panel 200 such that the liquid crystal molecules of the liquid crystal layer 3 that are arranged perpendicular to the surfaces of the two panels 100, 200 in the case in which an electric field does not exist are inclined parallel to the direction of the surface of the two electrodes 191, 270, and the luminance of the light passing through the liquid crystal layer 3 is changed according to the inclination degree of the liquid crystal molecules.

According to another exemplary embodiment of the present invention, the LCD may further include a spacer 325 to maintain the cell interval between the two display panels 100, 200, and the spacer 325 may be formed with the same layer as the colored members 320a, 320b.

As described above, in the LCD according to an exemplary embodiment of the present invention, the refresh signal line and the refresh capacitor are included such that the charges charged to the step-down capacitor are all discharged after one frame is finished, and as a result the voltages of two sub-pixel electrodes may be correctly controlled such that the lateral visibility may be closest to the front visibility and the deterioration of the display quality may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display including a plurality of pixels having a first sub-pixel electrode and a second sub-pixel electrode and arranged in a matrix, comprising:
   a first thin film transistor connected to the first sub-pixel electrode;
   a second thin film transistor connected to the second sub-pixel electrode;
   a third thin film transistor connected to the second sub-pixel electrode;
   a fourth thin film transistor connected to a drain electrode of the third thin film transistor;
   a first gate line connected to the first thin film transistor and the second thin film transistor;
   a data line connected to the first thin film transistor and the second thin film transistor;

a second gate line connected to the third thin film transistor; and a third gate line connected to the fourth thin film transistor, wherein the fourth thin film transistor is not connected to the first gate line.

2. The liquid crystal display of claim , wherein: the source electrode of the thin film transistor is connected to the drain electrode of the third thin film transistor, and the drain electrode of the fourth thin film transistor overlaps the first gate line.

3. The liquid crystal display of claim 2, wherein the third gate line is applied with a gate-on signal after the first gate line and the second gate line are applied with a gate-off signal.

4. The liquid crystal display of claim 3, wherein the third gate line is applied with the gate-on signal during a vertical blank period.

5. The liquid crystal display of claim 4, further comprising a capacitor electrode configured to overlap the drain electrode of the third thin film transistor.

6. The liquid crystal display of claim 1, wherein the third gate line is applied with the gate-on signal after the first gate line and the second gate line are applied with the gate-off signal.

7. The liquid crystal display of claim 6, wherein the third gate line is applied with the gate-on signal during the vertical blank period.

8. The liquid crystal display of claim 7, further comprising a capacitor electrode overlapping the drain electrode of the third thin film transistor.

9. The liquid crystal display of claim 1 further comprising a capacitor electrode configured to overlap the drain electrode of the third thin film transistor.

10. The liquid crystal display of claim 1, wherein the third gate line is applied with the gate-on signal during the vertical blank period.

11. The liquid crystal display of claim 1, wherein the first sub-pixel electrode and the second sub-pixel electrode include a plurality of branches, and a plurality of regions having different directions of edges of the branches.

12. The liquid crystal display of claim 11, wherein the edges of the branches form an angle of 45° or 135° with the first gate line.

13. A pixel for a liquid crystal display, the pixel comprising a pair of sub-pixels, the pair of sub-pixels having a first sub-pixel switching element, a second sub-pixel switching element, a third switching element, a fourth switching element, a first liquid crystal capacitor, a second liquid crystal capacitor, a step-down capacitor, and a refresh capacitor, wherein the first sub-pixel switching element and the second sub-pixel switching element are connected to a first gate line and a data line, and the third switching element is connected to a second gate line, wherein the first sub-pixel switching element and the second sub-pixel switching element each include a control terminal connected to the first gate line, an input terminal connected to the data line, and an output terminal respectively connected to the first liquid crystal capacitor and the second liquid crystal capacitor, wherein the third switching element includes a control terminal connected to the second gate line, an input terminal connected to the second liquid crystal capacitor and the output terminal connected to the step-down capacitor that is connected to the output terminal of the third switching element and a capacitor electrode line, wherein the fourth switching element includes a control terminal connected to a refresh signal line, an input terminal connected to the step-down capacitor, and an output terminal connected to the refresh capacitor that is connected to the output terminal of the fourth switching element and the second gate line, wherein when the first gate line is applied with a gate-on signal, the first liquid crystal capacitor and the second liquid crystal capacitor become equally charged, and when the gate signal applied to the first gate line is changed from the gate-on voltage to a gate-off voltage and the gate signal applied to the second gate line is changed from the gate-off voltage to the gate-on voltage, charges charged to the second liquid crystal capacitor are partially moved to the step-down capacitor, the charged voltage of the second liquid crystal capacitor being decreased and the step-down capacitor being charged, such that the charged voltage of the second liquid crystal capacitor is lower than the charged voltage of the first liquid crystal capacitor, and wherein the fourth switching element is not connected to the first gate line.

14. A pixel for a liquid crystal display of claim 13, wherein after one frame image is displayed, a refresh signal line is applied with the gate-on signal during a vertical blank period in which the data signal is not applied, and when the refresh signal line is applied with the gate-on signal such that the fourth switching element is turned on, charges charged to the step-down capacitor are moved to the refresh capacitor.

* * * * *